(12) United States Patent
Park et al.

(10) Patent No.: US 7,195,929 B2
(45) Date of Patent: Mar. 27, 2007

(54) MRAM INCLUDING UNIT CELL FORMED OF ONE TRANSISTOR AND TWO MAGNETIC TUNNEL JUNCTIONS (MTJS) AND METHOD FOR FABRICATING THE SAME

(75) Inventors: Wan-jun Park, Seoul (KR);
Hyung-soon Shin, Seoul (KR);
Seung-jun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 11/152,346

(22) Filed: Jun. 15, 2005

(65) Prior Publication Data
US 2005/0232003 A1    Oct. 20, 2005

Related U.S. Application Data

(62) Division of application No. 10/759,544, filed on Jan. 20, 2004, now Pat. No. 6,924,520.

(30) Foreign Application Priority Data
Jan. 18, 2003 (KR) .................................. 2003-3476

(51) Int. Cl.
*H01L 21/00* (2006.01)

(52) U.S. Cl. ................... 438/3; 257/E21.665; 365/158; 365/171; 365/173

(58) Field of Classification Search ........ 257/E21.665, 257/421, 424; 438/3; 365/158, 171, 173, 365/225.5
See application file for complete search history.

(56) References Cited

U.S. PATENT DOCUMENTS

| | | | |
|---|---|---|---|
| 6,864,551 B2 * | 3/2005 | Tsang | 257/421 |
| 6,885,577 B2 * | 4/2005 | Tang et al. | 365/158 |
| 6,891,193 B1 * | 5/2005 | Schwarz | 257/53 |
| 2003/0117835 A1 | 6/2003 | Kim et al. | |
| 2004/0211995 A1 * | 10/2004 | Park et al. | 257/294 |
| 2004/0253786 A1 * | 12/2004 | Hwang et al. | 438/257 |

* cited by examiner

*Primary Examiner*—Thao P. Le
(74) *Attorney, Agent, or Firm*—Lee & Morse, P.C.

(57) ABSTRACT

In an MRAM and method for fabricating the same, the MRAM includes a semiconductor substrate, a transistor formed on the semiconductor substrate, an interlayer dielectric formed on the semiconductor substrate to cover the transistor, and first and second MTJ cells formed in the interlayer dielectric to be coupled in parallel with a drain region of the transistor, wherein the first MTJ cell is coupled to a first bit line formed in the interlayer dielectric and the second MTJ cell is coupled to a second bit line formed in the interlayer dielectric, and wherein a data line is formed between the first MTJ cell and a gate electrode of the transistor to be perpendicular to the first bit line and the second bit line. The MRAM provides high integration density, sufficient sensing margin, high-speed operation and reduced noise, requires reduced current for recording data and eliminates a voltage offset.

21 Claims, 6 Drawing Sheets

US 7,195,929 B2

MRAM INCLUDING UNIT CELL FORMED OF ONE TRANSISTOR AND TWO MAGNETIC TUNNEL JUNCTIONS (MTJS) AND METHOD FOR FABRICATING THE SAME

CROSS REFERENCE TO RELATED APPLICATION(S)

This is a divisional application based on application Ser. No. 10/759,544, filed Jan. 20, 2004 now U.S. Pat. No. 6,924,520, the entire contents of which is hereby incorporated by reference.

BACKGROUND OF THE INVENTION

1. Field of the Invention

The present invention relates to a semiconductor memory device and a method for manufacturing the same. More particularly, the present invention relates to an MRAM including a unit cell formed of one transistor and two magnetic tunnel junctions (MTJs) and a method for fabricating the same.

2. Description of the Related Art

MRAM, which is one type of next-generation memory device, has properties of both DRAM and SRAM, and also has nonvolatile characteristics of flash memory.

MRAM typically includes a unit cell formed of one pass transistor 10 and one MTJ layer 20 as shown in FIG. 1, or includes two pass transistors, i.e., a first pass transistor 22 and a second pass transistor 24, and two MTJ layers, i.e., a first MTJ layer 22a and a second MTJ layer 24a, as shown in FIG. 2.

The MRAM of FIG. 1 further includes a reference cell array (not shown) corresponding to an intermediate value between logic "0" and logic "1," while in the MRAM of FIG. 2, a cell formed of the second pass transistor 24 and the second MTJ layer 24a is used as a reference cell of a cell formed of the first pass transistor 22 and the first MTJ layer 22a.

Thus, in the MRAM of FIG. 2, when data (e.g., "1") is recorded in the cell formed of the first pass transistor 22 and the first MTJ layer 22a, opposite data (e.g., "0") is simultaneously recorded in the cell formed of the second pass transistor 24 and the second MTJ layer 24a.

In the MRAM of FIG. 2, since a unit cell includes a main cell, where data is stored, and a reference cell, where inverted data of the data stored in the main cell is stored, a sensing margin of the MRAM is twice as wide as that of the MRAM of FIG. 1. Accordingly, data can be read more exactly using the MRAM of FIG. 2 than the MRAM of FIG. 1. Also, as shown in FIG. 2, since the main cell and the reference cell form a pair, noise in the unit cell can be reduced.

However, as a unit cell of the MRAM of FIG. 2 occupies a wider area than a unit cell of the MRAM of FIG. 1, the MRAM of FIG. 2 has a lower integration density than the MRAM of FIG. 1. However, because the MRAM of FIG. 1 has a smaller sensing margin than the MRAM of FIG. 2, a magnetic resistance (MR) ratio of the MTJ layer 20 should be higher than that of the first and second MTJ layers 22a and 24a, and the MTJ layer 20 should be uniform to normally operate the MRAM.

In FIGS. 1 and 2, reference numerals BL, DL, WL, and /BL respectively denote a bit line, a data line used with the bit line BL for recording data, a word line, and a bit line where inverted data of the data applied to the bit line BL is applied. The data line DL of FIG. 1 is disposed below the MTJ layer 20, as illustrated in FIGS. 3 and 4.

FIG. 3 illustrates a typical method for reading data recorded in an MRAM formed of one pass transistor and one MTJ layer.

Referring to FIG. 3, a predetermined voltage is applied to the word line WL such that the pass transistor 10 is turned on. Then, a read current IR is applied through the pass transistor 10 to the MTJ layer 20. Here, the data recorded in the MTJ layer 20 is read using a measured voltage. In FIG. 3, reference numerals S and D denote a source and a drain of the pass transistor 10. A conductive plug 26 is coupled to the drain D of the pass transistor 10 and a pad conductive layer 28 is formed on the conductive plug 26.

The foregoing method of reading data is similar to a method of reading data recorded in a MRAM having a twin-cell structure as shown in FIG. 2.

That is, in the MRAM of FIG. 2, the same amount of current is applied to both the main cell and the reference cell, and then voltages of bit lines BL and /BL are compared, and a difference therebetween is read. During this operation, drain voltages of the first and second pass transistors 22 and 24 may be changed to offset each other.

Meanwhile, a typical method of recording data in a MRAM formed of one pass transistor and one MTJ layer is performed by shifting a magnetized state of the MTJ layer.

Specifically, referring to FIG. 4, a predetermined first write current $lw_1$ and a predetermined second write current $lw_2$ are applied to the bit line BL and the data line DL, respectively. Here, a magnetic field occurs due to the first and second write currents $lw_1$ and $lw_2$, and a magnetized state of the MTJ layer 20 is shifted due to the magnetic field such that the MTJ layer 20 has magnetic resistance corresponding to data "0" or "1."

In the MRAM having a twin cell structure as shown in FIG. 2, data is recorded by applying predetermined write currents to the bit lines BL and /BL and the data line DL.

Specifically, a current in a direction opposite to a direction in which a current is applied to the bit line BL is applied to the bit line /BL in a state in which the first pass transistor 22 and the second pass transistor 24 are turned off. As a result, the first MTJ layer 22a and the second MTJ layer 24a are polarized in opposite directions to have different magnetic resistances. That is, predetermined data is recorded in the first MTJ layer 22a while inverted data of the predetermined data is recorded in the second MTJ layer 24a.

As described above, although the MRAM of FIG. 1 enables high integration density, an MR ratio thereof should be higher due to a low sensing margin and the MTJ layer should be uniform. The MRAM of FIG. 2 enables a high-speed operation, a sufficient sensing margin, and reduced noise, but has the disadvantage of a relatively low integration density owing to an increased area of a unit cell.

SUMMARY OF THE INVENTION

The present invention provides an MRAM having a high integration density and which enables a sufficient sensing margin and reduced noise.

The present invention provides an MRAM including one transistor and two MTJ layers and having an integration density as high as that of an MRAM including a single cell formed of one transistor and one MTJ layer, and which enables a sufficient sensing margin and reduced noise.

The present invention also provides a method for fabricating the MRAM including one transistor and two MTJ layers and having an integration density as high as that of an MRAM including a single cell formed of one transistor and one MTJ layer, and that enables a sufficient sensing margin and reduced noise.

In an effort to provide these and other features, it is a feature of an embodiment of the present invention to provide an MRAM including a semiconductor substrate, a transistor formed on the semiconductor substrate, an interlayer dielectric formed on the semiconductor substrate to cover the transistor, and first and second MTJ cells formed in the interlayer dielectric to be coupled in parallel with a drain region of the transistor, wherein the first MTJ cell is coupled to a first bit line formed in the interlayer dielectric and the second MTJ cell is coupled to a second bit line formed in the interlayer dielectric, and wherein a data line is formed between the first MTJ cell and a gate electrode of the transistor to be perpendicular to the first bit line and the second bit line.

The MRAM may further include a pad conductive layer disposed between the first MTJ cell and the data line to be coupled to the drain region, wherein the first MTJ cell and the second MTJ cell may be formed on the pad conductive layer. Further, a dummy data line may be formed below the pad conductive layer in a region in which the second MTJ cell is formed.

The MRAM may further include a contact hole formed in the interlayer dielectric to expose a portion of the drain region and a conductive plug filling the contact hole, wherein the pad conductive layer preferably contacts an entire exposed surface of the conductive plug filling the contact hole.

The interlayer dielectric preferably includes a first interlayer dielectric covering the transistor, a second interlayer dielectric formed on the first interlayer dielectric to cover the data line, and a third interlayer dielectric formed between the first and second bit lines and the second interlayer dielectric to surround the pad conductive layer, which is stacked on the second interlayer dielectric, and the first and second MTJ cells, which are formed on the pad conductive layer.

The MRAM may further include a second contact hole and a third contact hole formed in the third interlayer dielectric to expose predetermined portions of the first MTJ cell and the second MTJ cell, respectively. The first bit line is preferably formed on the third interlayer dielectric to be coupled to the first MTJ cell through the second contact hole. The second bit line is preferably formed on the third interlayer dielectric to be coupled to the second MTJ cell through the third contact hole.

In the MRAM, the first MTJ cell is preferably a main cell and the second MTJ cell is preferably a reference cell.

In accordance with another feature of an embodiment of the present invention, there is provided a method for fabricating an MRAM, including (1) forming a transistor on a semiconductor substrate, (2) forming a first interlayer dielectric on the semiconductor substrate to cover the transistor, (3) forming a first data line on the first interlayer dielectric, (4) forming a second interlayer dielectric on the first interlayer dielectric to cover the first data line, (5) forming a pad conductive layer on a portion of the second interlayer dielectric to be coupled to a drain region of the transistor, wherein the pad conductive layer is formed to be symmetric about the drain region, (6) forming a first MTJ cell and a second MTJ cell spaced apart from the first MTJ cell on the pad conductive layer, (7) forming a third interlayer dielectric on the second interlayer dielectric to cover the pad conductive layer, the first MTJ cell, and the second MTJ cell, and (8) forming a first bit line coupled to the first MTJ cell and a second bit line coupled to the second MTJ cell on the third interlayer dielectric.

In the method, forming the pad conductive layer on the portion of the second interlayer dielectric to be coupled to a drain region of the transistor may further include forming a first contact hole in the first interlayer dielectric and the second interlayer dielectric to be spaced apart from the first data line and to expose a portion of the drain region of the transistor, and forming the pad conductive layer on the portion of the second interlayer dielectric to fill the first contact hole.

Alternatively, forming the pad conductive layer on the portion of the second interlayer dielectric to be coupled to a drain region of the transistor may further include forming a first contact hole in the first interlayer dielectric and the second interlayer dielectric to be spaced apart from the first data line and to expose a portion of the drain region of the transistor, filling the first contact hole with a conductive plug, and forming the pad conductive layer on the portion of the second interlayer dielectric to contact an entire exposed surface of the conductive plug.

In the method, forming the first data line on the first interlayer dielectric may further include simultaneously forming a dummy data line on the first interlayer dielectric to be spaced apart from the first data line.

In the method, forming the first bit line coupled to the first MTJ cell and the second bit line coupled to the second MTJ cell on the third interlayer dielectric may further include forming a second contact hole and a third contact hole in the third interlayer dielectric to expose a portion of the first MTJ cell and a portion of the second MTJ cell, respectively, and simultaneously forming the first bit line filling the second contact hole and the second bit line filling the third contact hole on the third interlayer dielectric.

The MRAM according to the present invention enables integration density as high as that of an MRAM having a single cell structure, high-speed operation, a sufficient sensing margin, and reduced noise, and also eliminates a voltage offset and reduces current required to record data.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
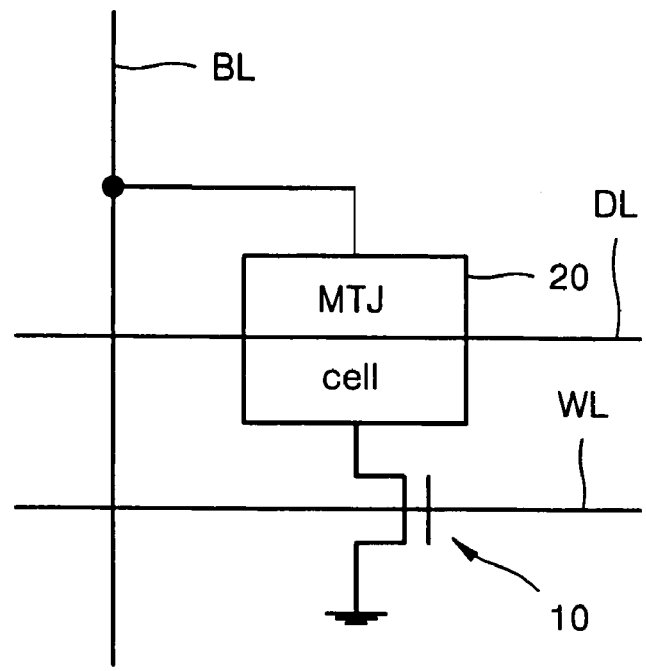
FIGS. 1 and 2 illustrate circuit diagrams of conventional MRAMs.

Korean Patent Application No. 2003-03476, filed on Jan. 18, 2003, and entitled: "MRAM Including Unit Cell Formed of One Transistor and Two MTJS and Method for Fabricating The Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions and the shapes of some elements are exaggerated for clarity. Like reference numerals refer to like elements throughout.

First, a circuit configuration of an MRAM according to an embodiment of the present invention will be described with reference to FIG. 5.

Figure 5:
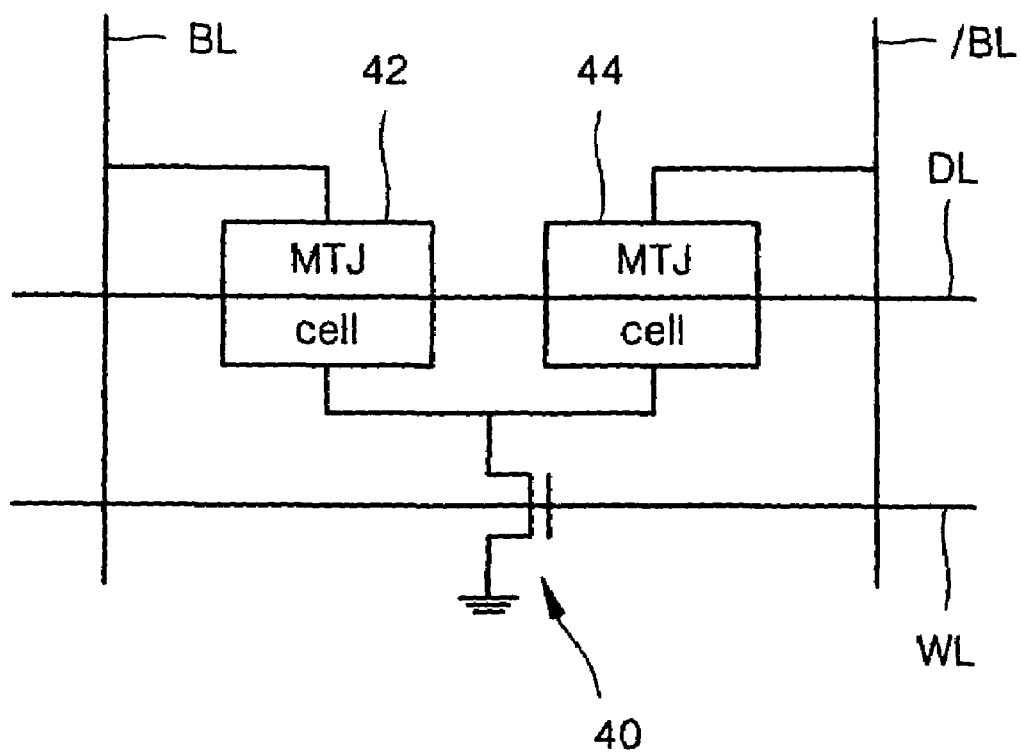
FIG. 5 illustrates a circuit diagram of an MRAM having one transistor and two MTJ layers according to a first embodiment of the present invention.

Referring to FIG. 5, the circuit configuration of the MRAM includes one pass transistor 40, and a first MTJ cell 42 and a second MTJ cell 44, which are coupled in parallel to the pass transistor 40. The first MTJ cell 42 is a main cell in which data "0" or "1" is recorded. That is, data can be variably recorded in the first MTJ cell 42, and the data recorded therein can be changed. The second MTJ cell 44, however, is a reference cell in which determined data is recorded. That is, while data "0" or "1" can be variably recorded in the first MTJ cell 42 and the data "0" or "1" recorded therein can be shifted to be data "1" or "0," respectively, only determined data can be recorded in the second MTJ cell 44 regardless of the data recorded in the first MTJ cell 42. Even if the data recorded in the first MTJ cell 42 is shifted, the data recorded in the second MTJ cell 44 does not change.

The first MTJ cell 42 and the second MTJ cell 44 are commonly coupled to a drain of the pass transistor 40. A gate of the pass transistor 40 is coupled to a word line WL of the MRAM, which is perpendicular to a first bit line BL and a second bit line /BL. The first bit line BL and the second bit line /BL are coupled to the first MTJ cell 42 and the second MTJ cell 44, respectively. The first bit line BL is used to read data recorded in the first MTJ cell 42, and is used together with the data line DL to record data in the first MTJ cell 42. The second bit line /BL, however, is used only to read data recorded in the second MTJ cell 44 because data recorded in the second MTJ cell 44 is not shifted even if data recorded in the first MTJ cell 42 is shifted.

The data line DL, which is used together with the first bit line BL when data is recorded in the first MTJ cell 42, is formed in parallel with the word line WL and is magnetically coupled to the first MTJ cell 42. Thus, when current is applied to the data DL to record data, the magnetized state, i.e., the magnetic resistance of the first MTJ cell 42 is shifted due to a magnetic field generated from the data line DL.

FIG. 5 shows the data line DL magnetically coupled also to the second MTJ cell 44. This is because a dummy data line is formed below the second MTJ cell 44 during the formation of the data line DL (see $DL_2$ of FIG. 6, which will be described subsequently).

A process to read data recorded in the MRAM, i.e., to read data recorded in the first MTJ cell 42, includes applying predetermined read currents to the first MTJ cell 42 and the second MTJ cell 44, comparing voltages of the first bit line BL and the second bit line /BL according to magnetic resistances of the first MTJ cell 42 and the second MTJ cell 44, and determining whether data recorded in the first MTJ cell 42 is identical to data recorded in the second MTJ cell 44. For this, a sensor amplifier (not shown) is coupled between one end of the first bit line BL and one end of the second bit line /BL.

Figure 2:
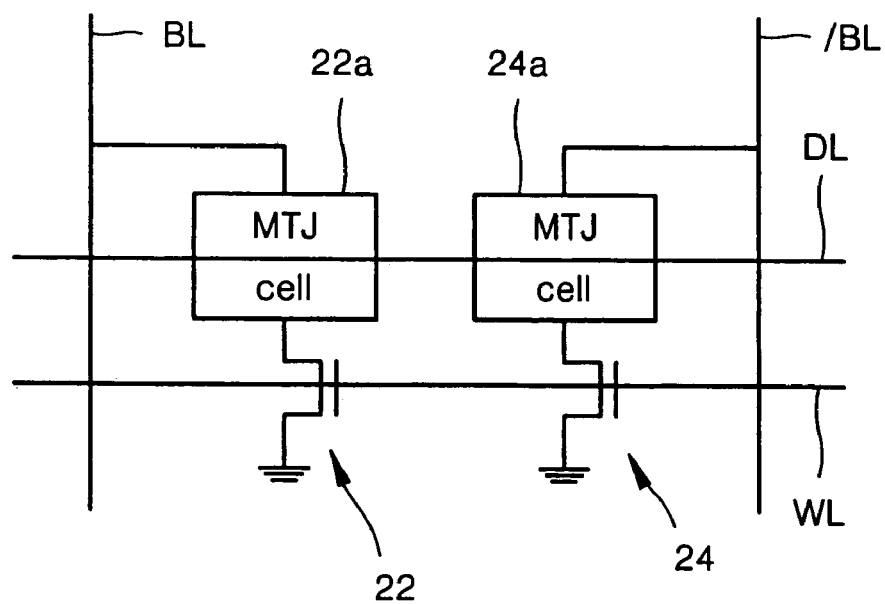
Figure 3:
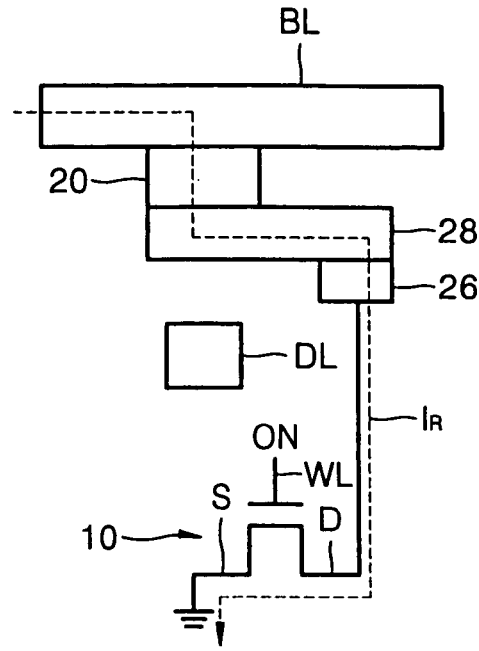
FIGS. 3 and 4 respectively illustrate cross-sectional views of a read operation and a write operation of the conventional MRAM of FIG. 1.
Figure 4:
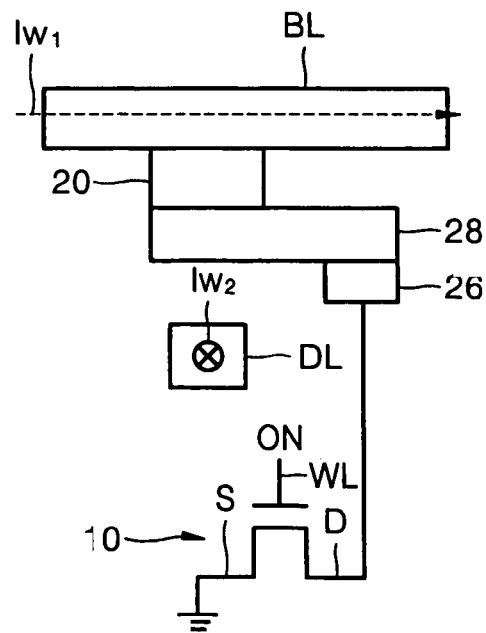

Unlike the conventional MRAM including a unit cell formed of two pass transistors 22 and 24 as shown in FIG. 2, the MRAM according to the preferred embodiment of the present invention includes only one pass transistor 40. As a result, a problem of a voltage offset commonly encountered in the conventional MRAM can be prevented in the MRAM of the present invention.

Next, a configuration of a physical MRAM that is equivalent to the circuital MRAM of the present invention illustrated in FIG. 5 will be described with reference to FIG. 6.

Figure 6:
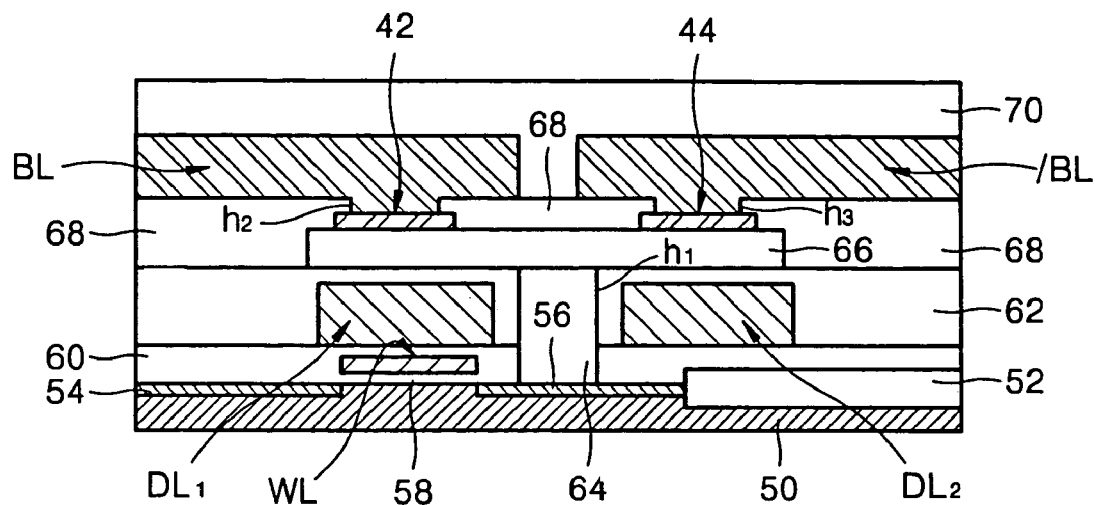
FIG. 6 illustrates a cross-sectional view of the MRAM having one transistor and two MTJ layers according to the first embodiment of the present invention.

In the physical MRAM illustrated in FIG. 6, field oxide layers 52 are formed in predetermined regions of a semiconductor substrate 50. A word line WL, i.e., a gate electrode, is disposed on the semiconductor substrate 50 between the field oxide layers 52, and a gate insulating layer 58 is disposed between the word line WL and the semiconductor substrate 50. A source region 54 and a drain region 56 are disposed in the semiconductor substrate 50 on opposite sides of the word line WL. Together, the word line WL, the source region 54, and the drain region 56 form a pass transistor 40. A first interlayer dielectric (ILD) 60 is formed over the semiconductor substrate 50 to cover the word line WL. A first data line $DL_1$ and a second data line $DL_2$ are formed on the first ILD 60 to be parallel to the word line WL. The first data line $DL_1$ is preferably formed on the first ILD 60 to correspond to a position at which the word line WL is formed. The first data line $DL_1$ is actually used to record data. The second data line $DL_2$ is formed on the first ILD 60 to correspond to a position at which the field oxide layer 52 is formed. The second data line $DL_2$ is a dummy data line, and is not used to record data, unlike the first data line $DL_1$. For this reason, the second data line $DL_2$ may be omitted from the MRAM. The first data line $DL_1$ is spaced apart from the second data line $DL_2$ by a predetermined distance. A second ILD 62 is formed to a predetermined thickness on the first ILD 60 to cover the first data line $DL_1$ and the second data line $DL_2$. The second ILD 62 is uniformly formed. A first contact hole $h_1$, which exposes the source region 54, is formed in the first ILD 60 and the second ILD 62 between the first data line $DL_1$ and the second data line $DL_2$. The first contact hole $h_1$ is filled with a conductive plug 64. A pad conductive layer 66 is formed on an entire surface of the conductive plug 64 and on the second ILD 62 disposed around the conductive plug 64. The pad conductive layer 66 preferably extends in a direction upward of the first data line $DL_1$ and the second data line $DL_2$. A first MTJ cell 42 and a second MTJ cell 44 are disposed on the pad conductive layer 66. The second MTJ cell 44 is a reference cell required for determining data recorded in the first MTJ cell 42. The first MTJ cell 42 is spaced apart from the second MTJ cell 44 by a same distance as the predetermined distance between the first data line $DL_1$ and the second data line $DL_2$. For this reason, the first MTJ cell 42 and the second MTJ cell 44 are preferably positioned directly over the first data line $DL_1$ and the second data line $DL_2$, respectively. A third ILD 68 is formed on the second ILD 62 to cover the pad conductive layer 66, the first MTJ cell 42, and the second MTJ cell 44. A second contact hole $h_2$ and a third contact hole $h_3$ are formed in the third ILD 68 to expose portions of the first MTJ cell 42 and the second MTJ cell 44, respectively. A first bit line BL and a second bit line /BL are disposed on the third ILD 68. The first bit line BL fills the second contact hole $h_2$ and contacts the first MJT cell 42, while the second bit line /BL fills the third contact hole $h_3$ and contacts the second MTJ cell 44. The first bit line BL is spaced apart from the second bit line /BL.

The first bit line BL and the second bit line /BL are perpendicular to the first data line $DL_1$ and the second data line $DL_2$. A fourth ILD 70 is disposed on the third ILD 68 to cover the first bit line BL and the second bit line /BL.

As described above, the MRAM according to the present invention comprises one pass transistor, which includes a word line WL, a source region 54, and a drain region 56, and two MTJ cells 42 and 44, which are coupled in parallel with the drain region 56. Thus, the MRAM according to the present invention requires a smaller area per unit cell than the conventional MRAM having a twin cell structure as shown in FIG. 2. As a result, the integration density can be improved.

Typically, because the pass transistor is turned off during a data read operation, a current flowing through the MTJ cell is zero (0). However, in the MRAM of the present invention, the MTJ cell includes an upper plate, a lower plate, and an insulating layer disposed therebetween, and current may flow through the lower plate of the MTJ cell. Accordingly, in the present invention, currents applied to the bit line and the data line for shifting a polarized state of the MTJ cell can be minimized during a data recording operation.

Hereinafter, a method for fabricating the MRAM of the present invention will be described.

Figure 7:
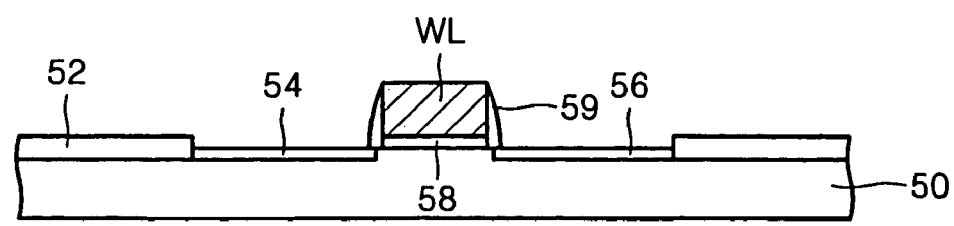
FIGS. 7 through 10 illustrate cross-sectional views of a method for fabricating the MRAM of FIG. 6.

Referring to FIG. 7, an active region, where elements are formed, and an inactive region (i.e., a field region) are defined in a semiconductor substrate 50. Field oxide layers 52 are formed on the field region. A gate insulating layer 58 and a word line WL (i.e., a gate electrode) are sequentially stacked as a gate stack on the active region between the field oxide layers 52. A gate spacer 59 is formed on the sidewalls of the gate stack. Conductive impurity ions are implanted into the semiconductor substrate 50, thereby forming a source region 54 and a drain region 56 in the semiconductor substrate 50 between the gate spacer 59 and the field oxide layers 52. In doing so, a pass transistor such as that shown in FIG. 5 is formed on the semiconductor substrate 50. In a case in which the semiconductor substrate 50 is an n-type semiconductor substrate, the conductive impurity ions are preferably p-type ions. In a case in which the semiconductor substrate 50 is a p-type semiconductor substrate, the conductive impurity ions are preferably n-type ions.

Figure 8:
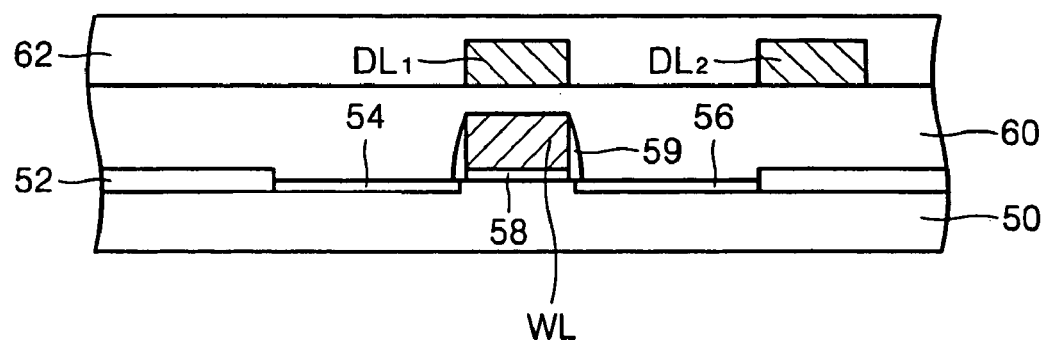

Referring to FIG. 8, a first ILD 60 is formed on the semiconductor substrate 50 to cover the resultant structure on which the gate spacer 59 is formed, and then the first ILD 60 is planarized. A first data line $DL_1$ and a second data line $DL_2$ are formed on the first ILD 60. The first data line $DL_1$ is spaced apart from the second data line $DL_2$ by a predetermined distance. The first data line $DL_1$, a conductive line, is actually used to record data and is preferably formed directly over and parallel to the word line WL. The second data line $DL_2$, however, is a dummy data line and is not used to record data. The second data line $DL_2$ is formed over field oxide layer 52. The second data line $DL_2$ may be omitted from the MRAM. A second ILD 62 is formed on the first ILD 60 to cover the entire surface of the first data line $DL_1$ and the second data line $DL_2$ and then is planarized.

Figure 9:
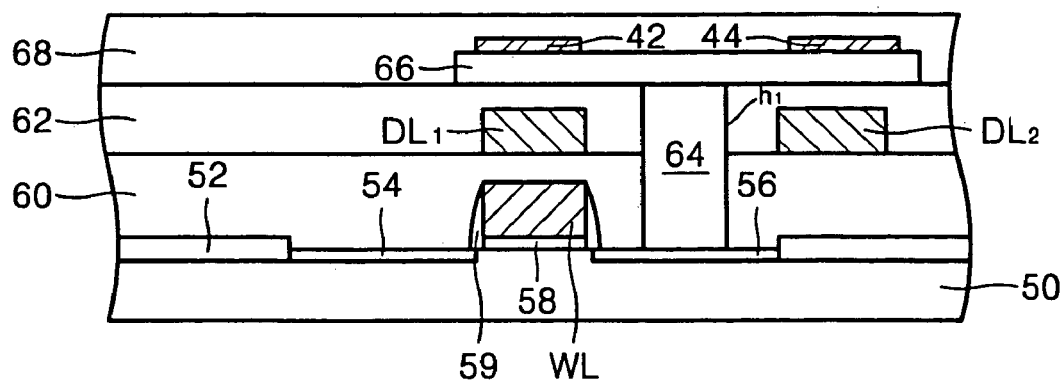

Referring to FIG. 9, a first contact hole $h_1$, which exposes the drain region 56, is formed in the first ILD 60 and the second ILD 62 between the first data line $DL_1$ and the second data line $DL_2$. A conductive plug 64 fills the first contact hole $h_1$. A pad conductive layer 66 is formed on the second ILD 62 to cover the entire surface of the conductive plug 64. The pad conductive layer 66 is preferably formed of the same material as the conductive plug 64. In a case in which the first contact hole $h_1$ is deeply formed, i.e., in a case in which an aspect ratio is high, it is preferable that the conductive plug 64 and the pad conductive layer 66 are separately formed as described above. However, in a case in which the first contact hole $h_1$ is shallowly formed, the pad conductive layer 66 and the conductive plug 64 may be formed at the same time.

Meanwhile, considering that two MTJ cells are spaced apart from each other on the pad conductive layer 66 and data is recorded in the MRAM as described below, the two MTJ cells are preferably formed directly over the first data line $DL_1$ and the second data line $DL_2$, respectively. Thus, the pad conductive layer 66 is preferably extended in a direction upward of the first data line $DL_1$ and the second data line $DL_2$.

Next, a first MTJ cell 42 and a second MTJ cell 44 are formed on the pad conductive layer 66. The first MTJ cell 42 and the second MTJ cell 44 are preferably formed at positions corresponding to the first data line $DL_1$ and the second data line $DL_2$, respectively. Accordingly, the first MTJ cell 42 is preferably spaced apart from the second MTJ cell 44 by the same distance as the distance between the first data line $DL_1$ and the second data line $DL_2$. As described above, the first MTJ cell 42 and the second MTJ cell 44 are formed on the pad conductive layer 66. As a result, the first MTJ cell 42 and the second MTJ cell 44 are coupled to the pass transistor, including the gate stack, the source region, and the drain region, through the pad conductive layer 66 and the conductive plug 64. That is, the first MTJ cell 42 and the second MTJ cell 44 are coupled in parallel with the pass transistor. A third ILD 68 is formed on the second ILD 62 to cover the pad conductive layer 66, the first MTJ cell 42, and the second MTJ cell 44, and then the third ILD 68 is planarized.

Figure 10:
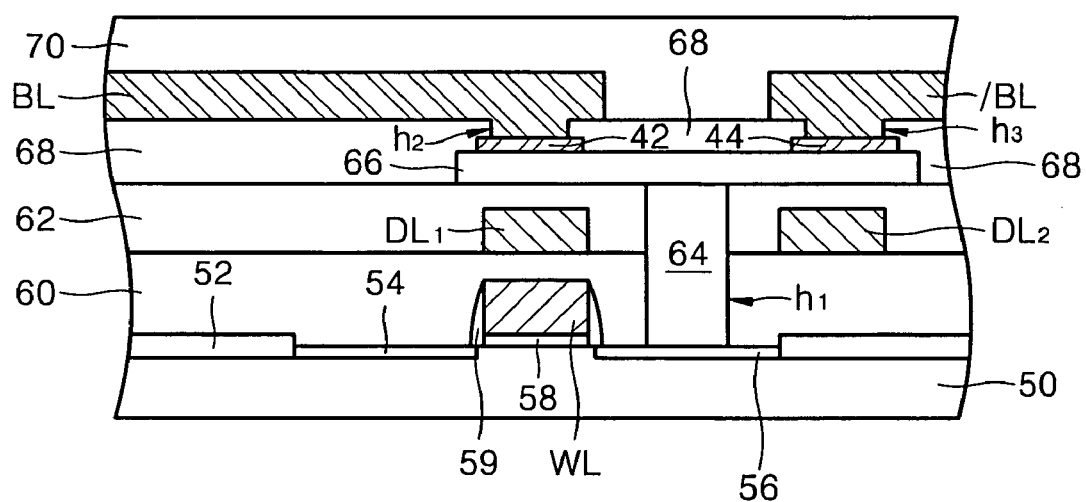

Referring to FIG. 10, a second contact hole $h_2$ and a third contact hole $h_3$ are formed in the third ILD 68 to expose portions of the first MTJ cell 42 and the second MTJ cell 44, respectively. Then, a first bit line BL is formed on the third ILD 68 to fill the second contact hole $h_2$ and contact the exposed portion of the first MTJ cell 42. Simultaneously, a second bit line /BL is formed to fill the third contact hole $h_3$ and contact the exposed portion of the second MTJ cell 44. The first bit line BL is preferably formed to be perpendicular to the word line WL, the first data line $DL_1$, and the second data line $DL_2$. The second bit line /BL is formed to be spaced apart from the first bit line BL by a predetermined distance and is preferably formed in parallel with the first bit line BL. A fourth ILD 70 is then formed on the third ILD 68 to cover the first bit line BL and the second bit line /BL.

As described above, the MRAM according to the present invention includes a unit cell formed of one pass transistor and two MTJ cells. One of the MTJ cells that are coupled in parallel with the pass transistor is a main cell in which data can be recorded, and the other is a reference cell in which determined data is recorded. Thus, the MRAM of the present invention has an integration density as high as that of an MRAM having a single cell structure, and enables sufficient sensing margin, high-speed operation, and reduced noise. Further, unlike an MRAM having a twin cell structure, since the MRAM according to the present invention includes a unit cell formed of one pass transistor, voltage offset is eliminated. In addition, the MRAM of the present invention allows current to flow through a lower plate of an MTJ cell during a recording operation, when the pass transistor is typically turned off. Thus, reduced current is required to record data in the MRAM of the present invention.

Preferred embodiments of the present invention have been disclosed herein and, although specific terms are employed, they are used and are to be interpreted in a generic and descriptive sense only and not for purpose of limitation. For example, those of ordinary skill in the art will understand that the first data line $DL_1$ and the second data line $DL_2$ may be formed as a double layer. Also, those of ordinary skill in the art will understand that the first MTJ cell and the second MTJ cell may be formed using different processes and different materials. Accordingly, it will be understood by those of ordinary skill in the art that various changes in form and details may be made without departing from the spirit and scope of the present invention as set forth in the following claims.

What is claimed is:

1. A method for fabricating an MRAM, comprising:
   (1) forming a transistor on a semiconductor substrate;
   (2) forming a first interlayer dielectric on the semiconductor substrate to cover the transistor;
   (3) forming a first data line on the first interlayer dielectric;
   (4) forming a second interlayer dielectric on the first interlayer dielectric to cover the first data line;
   (5) forming a pad conductive layer on a portion of the second interlayer dielectric to be coupled to a drain region of the transistor, wherein the pad conductive layer is formed to be symmetric about the drain region;
   (6) forming a first MTJ cell and a second MTJ cell spaced apart from the first MTJ cell on the pad conductive layer;
   (7) forming a third interlayer dielectric on the second interlayer dielectric to cover the pad conductive layer, the first MTJ cell, and the second MTJ cell; and
   (8) forming a first bit line coupled to the first MTJ cell and a second bit line coupled to the second MTJ cell on the third interlayer dielectric.

2. The method as claimed in claim 1, wherein forming the pad conductive layer on the portion of the second interlayer dielectric to be coupled to a drain region of the transistor further comprises:
   forming a first contact hole in the first interlayer dielectric and the second interlayer dielectric to be spaced apart from the first data line and to expose a portion of the drain region of the transistor; and
   forming the pad conductive layer on the portion of the second interlayer dielectric to fill the first contact hole.

3. The method as claimed in claim 1, wherein forming the pad conductive layer on the portion of the second interlayer dielectric to be coupled to a drain region of the transistor further comprises:
   forming a first contact hole in the first interlayer dielectric and the second interlayer dielectric to be spaced apart from the first data line and to expose a portion of the drain region of the transistor;
   filling the first contact hole with a conductive plug; and
   forming the pad conductive layer on the portion of the second interlayer dielectric to contact an entire exposed surface of the conductive plug.

4. The method as claimed in claim 1, wherein forming the first data line on the first interlayer dielectric further comprises simultaneously forming a dummy data line on the first interlayer dielectric to be spaced apart from the first data line.

5. The method as claimed in claim 1, wherein forming the first bit line coupled to the first MTJ cell and the second bit line coupled to the second MTJ cell on the third interlayer dielectric further comprises:

forming a second contact hole and a third contact hole in the third interlayer dielectric to expose a portion of the first MTJ cell and a portion of the second MTJ cell, respectively; and
simultaneously forming the first bit line filling the second contact hole and the second bit line filling the third contact hole on the third interlayer dielectric.

6. The method as claimed in claim 1, wherein forming the first data line further comprises forming the first data line between a gate electrode of the transistor and the first MTJ cell.

7. The method as claimed in claim 1, wherein forming the first and second bit lines further comprises forming the first and second bit lines to be perpendicular to the first data line.

8. The method as claimed in claim 1, wherein forming the first data line further comprises forming the first data line parallel to a word line.

9. The method as claimed in claim 8, wherein forming the first data line further comprises forming the first data line over the word line.

10. The method as claimed in claim 4, wherein forming the dummy data line further comprises forming the dummy data line over a field region of the transistor.

11. The method as claimed in claim 4, wherein forming the first MTJ cell and second MTJ cell further comprises forming the first MTJ cell over the first data line and forming the second MTJ cell over the dummy data line.

12. The method as claimed in claim 4, wherein forming the pad conductive layer includes forming the pad conductive layer over the first and dummy data lines.

13. The method as claimed in claim 4, wherein the first and second MTJ cells are spaced apart by a same distance as the first and dummy data lines.

14. The method as claimed in claim 13, wherein filling the first contact hole and forming the pad conductive layer are performed simultaneously.

15. A method for fabricating an MRAM, comprising:
   forming a transistor on a semiconductor substrate;
   forming a first interlayer dielectric on the semiconductor substrate to cover the transistor;
   forming a first data line on the first interlayer dielectric above a gate electrode of the transistor;
   forming a second interlayer dielectric on the first interlayer dielectric to cover the first data line;
   forming a first MTJ cell and a second MTJ cell spaced apart from the first MTJ cell on the second interlayer dielectric layer;
   forming a third interlayer dielectric on the second interlayer dielectric to cover the first MTJ cell, and the second MTJ cell; and
   forming a first bit line coupled to the first MTJ cell and a second bit line coupled to the second MTJ cell on the third interlayer dielectric, the first and second bit lines being perpendicular to the first data line.

16. The method as claimed in claim 15, further comprising forming a pad conductive layer between the second interlayer dielectric and the first and second MTJ cells.

17. The method as claimed in claim 15, wherein forming the first data line further comprises forming the first data line parallel to a word line.

18. The method as claimed in claim 17, wherein forming the first data line further comprises forming the first data line over the word line.

19. The method as claimed in claim 15, wherein forming the first data line on the first interlayer dielectric further comprises simultaneously forming a dummy data line on the first interlayer dielectric to be spaced apart from the first data line.

20. The method as claimed in claim 19, wherein forming the dummy data line further comprises forming the dummy data line over a field region of the transistor.

21. The method as claimed in claim 19, wherein forming the first MTJ cell and second MTJ cell further comprises forming the first MTJ cell over the first data line and forming the second MTJ cell over the dummy data line.

* * * * *